(12) United States Patent
Lee et al.

(10) Patent No.: US 8,278,681 B2
(45) Date of Patent: Oct. 2, 2012

(54) LIGHT-EMITTING DIODE PACKAGE AND WAFER-LEVEL PACKAGING PROCESS OF LIGHT-EMITTING DIODE

(75) Inventors: Chia-En Lee, Chiayi (TW); Cheng-Ta Kuo, Hsinchu (TW); Der-Ling Hsia, Taoyuan County (TW)

(73) Assignee: Lextar Electronics Corp., Hsinchu (TW)

( * ) Notice: Subject to any disclaimer, the term of this patent is extended or adjusted under 35 U.S.C. 154(b) by 254 days.

(21) Appl. No.: 12/469,669

(22) Filed: May 20, 2009

(65) Prior Publication Data
US 2010/0258827 A1 Oct. 14, 2010

(30) Foreign Application Priority Data
Apr. 9, 2009 (TW) .................. 98111840 A

(51) Int. Cl.
*H01L 33/00* (2010.01)
(52) U.S. Cl. .............. 257/100; 257/13; 257/79; 257/85; 257/88; 257/90; 257/94
(58) Field of Classification Search .............. 257/13, 257/79–103
See application file for complete search history.

(56) References Cited

U.S. PATENT DOCUMENTS

| | | | |
|---|---|---|---|
| 7,250,638 B2 | 7/2007 | Lee et al. | |
| 2006/0097385 A1 | 5/2006 | Negley | |
| 2006/0249736 A1* | 11/2006 | Lee et al. | 257/79 |
| 2008/0035935 A1 | 2/2008 | Shum | |
| 2009/0173963 A1* | 7/2009 | Hsu et al. | 257/99 |
| 2010/0177519 A1* | 7/2010 | Schlitz | 362/294 |
| 2010/0193819 A1* | 8/2010 | Sorg et al. | 257/98 |

* cited by examiner

*Primary Examiner* — Jae Lee
(74) *Attorney, Agent, or Firm* — Thomas|Kayden

(57) ABSTRACT

A wafer-level packaging process of a light-emitting diode is provided. First, a semiconductor stacked layer is formed on a growth substrate. A plurality of barrier patterns and a plurality of reflective layers are then formed on the semiconductor stacked layer, wherein each reflective layer is surrounded by one of the barrier patterns. A first bonding layer is then formed on the semiconductor stacked layer to cover the barrier patterns and the reflective layers. Thereafter, a carrying substrate having a plurality of second bonding layers and a plurality of conductive plugs electrically insulated from each other is provided, and the first bonding layer is bonded with the second bonding layer. The semiconductor stacked layer is then separated from the growth substrate. Next, the semiconductor stacked layer is patterned to form a plurality of semiconductor stacked patterns. Next, each semiconductor stacked pattern is electrically connected to the conductive plug.

8 Claims, 11 Drawing Sheets

LIGHT-EMITTING DIODE PACKAGE AND WAFER-LEVEL PACKAGING PROCESS OF LIGHT-EMITTING DIODE

CROSS-REFERENCE TO RELATED APPLICATION

This application claims the priority benefit of Taiwan application serial no. 98111840, filed on Apr. 9, 2009. The entirety of the above-mentioned patent application is hereby incorporated by reference herein and made a part of specification.

BACKGROUND OF THE INVENTION

1. Field of the Invention

The present invention relates to a packaging process of a light-emitting diode. More particularly, the present invention relates to a wafer-level packaging process of a light-emitting diode.

2. Description of Related Art

Since light-emitting diodes (LEDs) have advantages of long lifespan, small size, high shock-resisting capability, low heat irradiation and low power consumption, etc, the LEDs have been widely applied to home appliances and various equipments to serve as indicators or light sources. Recently, since the LEDs have a general development trend of multi color and high brightness, application of the LEDs now has been expanded to displays, large-scale outdoor display panels and traffic lights, etc., and in the future, the LEDs may even replace tungsten lamps and mercury lamps to serve as illumination light sources with features of both energy saving and environmental protection.

Presently, most of the commonly used LED packages utilize circuit boards or lead frames to serve as carriers for LED chips. In the LED package, the LED chip can be electrically connected to other electronic products through traces of the circuit board and leads of the lead frame. Moreover, the heat generated by the LED chip can also dissipated to external of the LED package through the traces of the circuit board or the leads of the lead frame. However, as a light-emitting efficiency of the LED chip is continually increased, a heat-dissipation problem of the LED chip in the LED package utilizing the circuit board or the lead frame as the carrier cannot be effectively resolved. Therefore, how to effectively dissipate the heat generated by the LED chip to the external of the LED package has become one of the major subjects to designers.

SUMMARY OF THE INVENTION

The present invention provides a wafer-level packaging process of a light-emitting diode (LED). First, a semiconductor stacked layer is formed on a growth substrate. Next, a plurality of barrier patterns and a plurality of reflective layers are formed on the semiconductor stacked layer, wherein each reflective layer is surrounded by one of the barrier patterns. Next, a first bonding layer is formed on the semiconductor stacked layer to cover the barrier patterns and the reflective layers. Next, a carrying substrate having a plurality of second bonding layers and a plurality of conductive plugs electrically insulated from each other is provided. Next, the first bonding layer is bonded with the second bonding layer. Then, the semiconductor stacked layer is separated from the growth substrate. Next, the semiconductor stacked layer is patterned to form a plurality of patterned semiconductor stacked layers. Next, each of the patterned semiconductor stacked layers is electrically connected to one of the conductive plugs. Finally, an encapsulant is formed on the carrying substrate to cover the patterned semiconductor stacked layers.

In an embodiment of the present invention, a method of forming the semiconductor stacked layer comprises forming a first-type doped semiconductor layer on the growth substrate, forming a light-emitting layer on the first-type doped semiconductor layer, and forming a second-type doped semiconductor layer on the light-emitting layer.

In an embodiment of the present invention, a material of the barrier pattern comprises silicon oxide, silicon nitride or indium tin oxide, and a method of forming the barrier patterns comprises performing a thin-film deposition method, a photolithography process and an etching process.

In an embodiment of the present invention, a material of the reflective layer comprises silver, and a method of forming the reflective layer comprises evaporation or sputtering.

In an embodiment of the present invention, a material of the first bonding layer comprises titanium, tungsten, titanium tungsten, nickel, platinum, aurum, aurum tin alloy, indium, or combinations thereof, and a method of forming the first bonding layer comprises evaporation or sputtering.

In an embodiment of the present invention, a method of separating the semiconductor stacked layer from the growth substrate comprises a laser lift-off process, a wet etching process, a grinding process, or a polishing process.

In an embodiment of the present invention, when the semiconductor stacked layer is patterned to form a plurality of the patterned semiconductor stacked layers, the first bonding layer and the barrier pattern are further patterned.

In an embodiment of the present invention, a method of electrically connecting each of the patterned semiconductor stacked layers and the carrying substrate comprises forming a dielectric layer on each of the patterned semiconductor stacked layers, wherein the dielectric layer at least covers a sidewall of the patterned semiconductor stacked layer; and forming a plurality of bridge wires on the carrying substrate and the dielectric layer, wherein the bridge wires are electrically connected to the carrying substrate and each of the patterned semiconductor stacked layers.

In an embodiment of the present invention, the encapsulant is entirely or partially formed on the carrying substrate to cover the patterned semiconductor stacked layers.

In an embodiment of the present invention, before the encapsulant is formed, a light conversion layer is first formed to cover the patterned semiconductor stacked layers.

In an embodiment of the present invention, the wafer-level packaging process of a LED further comprises dividing the carrying substrate to singularize the LEDs.

The present invention provides a LED package comprising at least a patterned semiconductor stacked layer, a reflective layer, a barrier pattern, a first bonding layer, a carrying substrate, at least a bridge conductor and an encapsulant. The patterned semiconductor stacked layer has a top surface and a bottom surface, and the reflective layer is disposed on the bottom surface. The barrier pattern is disposed on the bottom surface and surrounds the reflective layer, and the first bonding layer is disposed on the bottom surface to cover the barrier pattern and the reflective layer. The carrying substrate comprises a conductive substrate, an insulating layer, at least one conductive plug and a second bonding layer, wherein the conductive substrate has at least a through hole, and the insulating layer is disposed on a sidewall of the through hole. The conductive plug is disposed in the through hole and is electrically insulated to the conductive substrate, and the second bonding layer is disposed on the conductive substrate, so that the second bonding layer is electrically connected to the bottom surface through the first bonding layer. The bridge conductor is electrically connected to the top surface and the conductive plug. Moreover, the encapsulant is disposed on the carrying substrate to cover the patterned semiconductor stacked layers.

In an embodiment of the present invention, a material of the barrier pattern comprises silicon oxide, silicon nitride or indium tin oxide.

In an embodiment of the present invention, a material of the reflective layer comprises silver.

In an embodiment of the present invention, a material of the first bonding layer comprises titanium, tungsten, titanium tungsten, nickel, platinum, aurum, aurum tin alloy, indium, or combinations thereof.

In an embodiment of the present invention, the carrying substrate further comprises a pad, wherein the pad is electrically connected to the top surface through the conductive plug and the bridge conductor, and the pad is electrically insulated to the conductive substrate.

In an embodiment of the present invention, the pad and the patterned semiconductor stacked layer are respectively located at two opposite sides of the conductor substrate.

In an embodiment of the present invention, the LED package further comprises a dielectric layer, wherein the dielectric layer is disposed on a sidewall of the patterned semiconductor stacked layer, and is located between the patterned semiconductor stacked layer and the bridge conductor.

In an embodiment of the present invention, the carrying substrate further comprises a heat sink, wherein the heat sink is disposed on the conductive substrate, and the heat sink and the patterned semiconductor stacked layer are respectively located at two opposite sides of the conductive substrate.

In an embodiment of the present invention, the LED package further comprises a light conversion layer covering the patterned semiconductor stacked layers.

Accordingly, since fabrications of the reflective layers and the barrier patterns are integrated to the wafer-level packaging process of the LEDs, LED packages with good optical properties and good reliability can be fabricated according to the wafer-level packaging process of the present invention.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1:
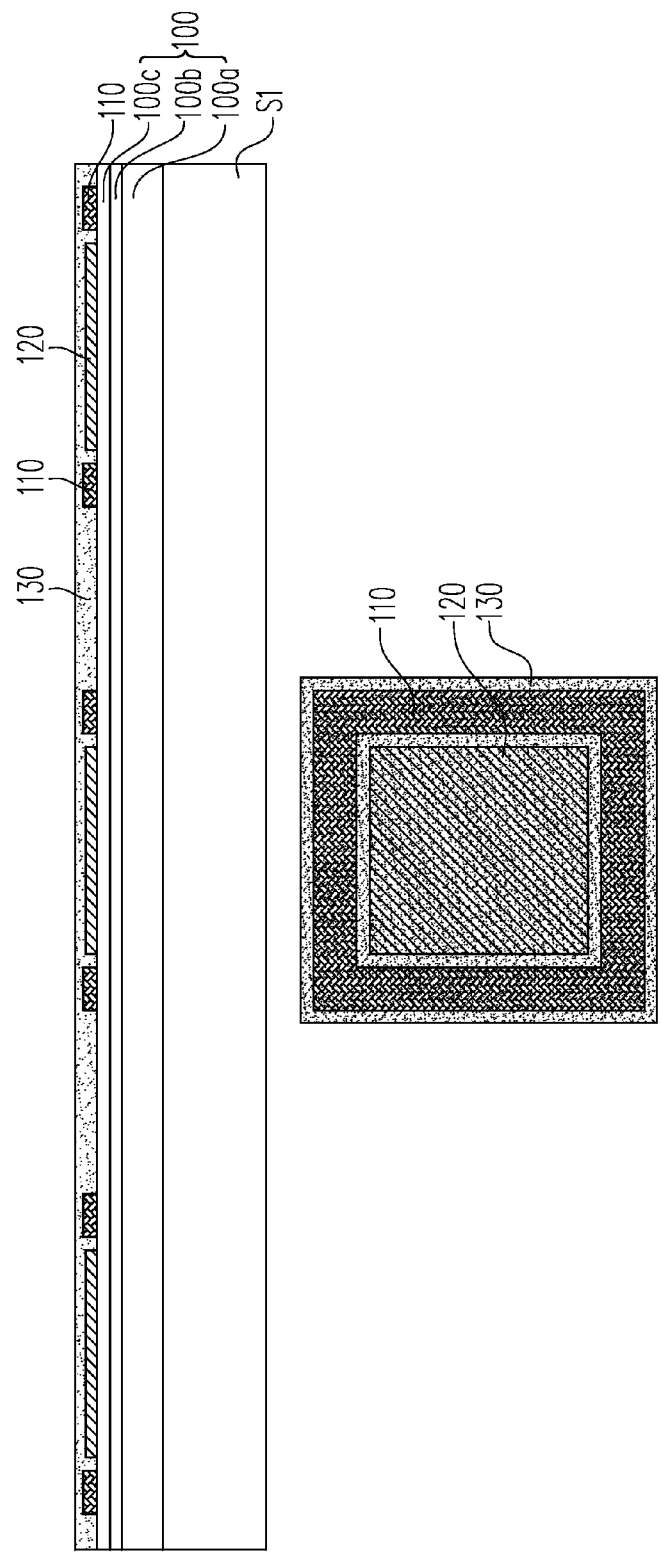
FIGS. 1-7 are cross-sectional views of a wafer-level packaging process of a light-emitting diode (LED) according to a first embodiment of the present invention.

FIGS. 1-7 are cross-sectional views of a wafer-level packaging process of a light-emitting diode (LED) according to the first embodiment of the present invention. Referring to FIG. 1, a semiconductor stacked layer 100 is formed on a growth substrate S1, wherein the semiconductor stacked layer 100 includes a first-type doped semiconductor layer 100a, a light-emitting layer 100b located on the first-type doped semiconductor layer 100a, and a second-type doped semiconductor layer 100c located on the light-emitting layer 100b. In the present embodiment, the first-type doped semiconductor layer 100a, the light-emitting layer 100b, and the second-type doped semiconductor layer 100c of the semiconductor stacked layer 100 can be sequentially fabricated on the growth substrate S1 according to a metal organic chemical vapor deposition (MOCVD) process. For example, the first-type doped semiconductor layer 100a is an N-type doped semiconductor layer, the second-type doped semiconductor layer 100c is a P-type doped semiconductor layer, and the light-emitting layer 100b is a multiple quantum well (MQW) layer.

Next, a plurality of barrier patterns 110 and a plurality of reflective layers 120 are formed on the semiconductor stacked layer 100, wherein each reflective layer 120 is surrounded by one of the barrier patterns 110. In detail, in the present embodiment, the barrier patterns 110 can be first formed on the semiconductor stacked layer 100, and then the reflective layers 120 are fabricated. When the reflective layers 120 are fabricated, the barrier patterns 110 can effectively prevent a diffusion of the reflective layers on the semiconductor stacked layer 100, so as to effectively define a distribution range of the reflective layers 120. In the present embodiment, a material of the barrier pattern 110 includes silicon oxide, silicon nitride or indium tin oxide, and a method of forming the barrier patterns 110 includes performing a thin-film deposition method, a photolithography process and an etching process. A material of the reflective layer 120 includes silver, and a method of forming the reflective layers 120 includes evaporation or sputtering. According to FIG. 1, the barrier pattern 120 is, for example, a rectangular ring-shape pattern, and the reflective layer 120 is, for example, a conductive reflective thin-film with a rectangular pattern. However, the shape of the barrier pattern 120 is not limited by the present invention. In other words, the barrier pattern 120 can also include a plurality of discrete strip patterns arranged in a ring-shape.

Next, a first bonding layer 130 is formed on the semiconductor stacked layer 100 to cover the barrier patterns 110 and the reflective layers 120, wherein an ohmic contact is formed between the first bonding layer 130 and the reflective layer 120, and the ohmic contact is also formed between the reflective layer 120 and the semiconductor stacked layer 100. In the present embodiment, a material of the first bonding layer 130 includes titanium, tungsten, titanium tungsten, nickel, platinum, aurum, aurum tin alloy, indium, or combinations thereof, and a method of forming the first bonding layer 130 comprises evaporation or sputtering.

Figure 2:
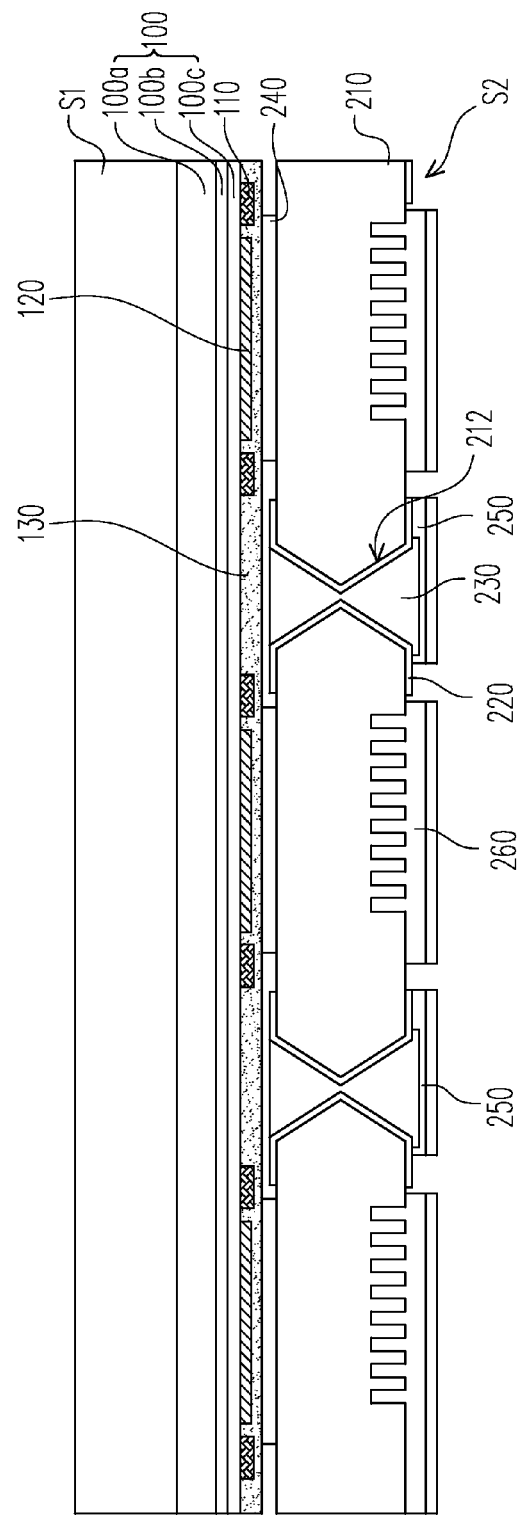

Next, referring to FIG. 2, a carrying substrate S2 is provided, and the carrying substrate S2 includes a conductive substrate 210, an insulating layer 220, at least a conductive plug 230 and a second bonding layer 240. The conductive substrate 210 has at least a through hole 212, and the insulating layer 220 is disposed on the sidewall of the through hole 212. The conductive plug 230 is disposed in the through hole 212 and is electrically insulated to the conductive substrate 210. The second bonding layer 240 is disposed on the conductive substrate 210, and the second bonding layer 240 is electrically connected to the conductive substrate 210 through the first bonding layer 130. Moreover, the carrying substrate S2 further includes a pad 250, wherein the pad 250 is electrically connected to the semiconductor stacked layer 100 through the conductive plug 230, and the pad 250 is electrically insulated to the conductive substrate 210. As shown in FIG. 2, the pad 250 and the semiconductor layer 100 are respectively located at two opposite sides of the conductive substrate 210. In the present embodiment, a material of the second bonding layer 240 includes titanium, tungsten, titanium tungsten, nickel, platinum, aurum, aurum tin alloy, indium, or combinations thereof, and a method of forming the second bonding layer 240 comprises evaporation or sputtering.

The carrying substrate S2 of the present embodiment may includes a heat sink 260, wherein the heat sink 260 is disposed on a surface of the conductive substrate 210, and the heat sink 260 and the semiconductor stacked layer 100 are respectively located at two opposite sides of the conductive substrate 210.

After the carrying substrate S2 is provided, the first bonding layer 130 is bonded with the second bonding layer 240. In the present embodiment, the first bonding layer 130 can be properly bonded with the second bonding layer 240 through thermal compression bonding, eutectic bonding, or microwave bonding.

Figure 3:
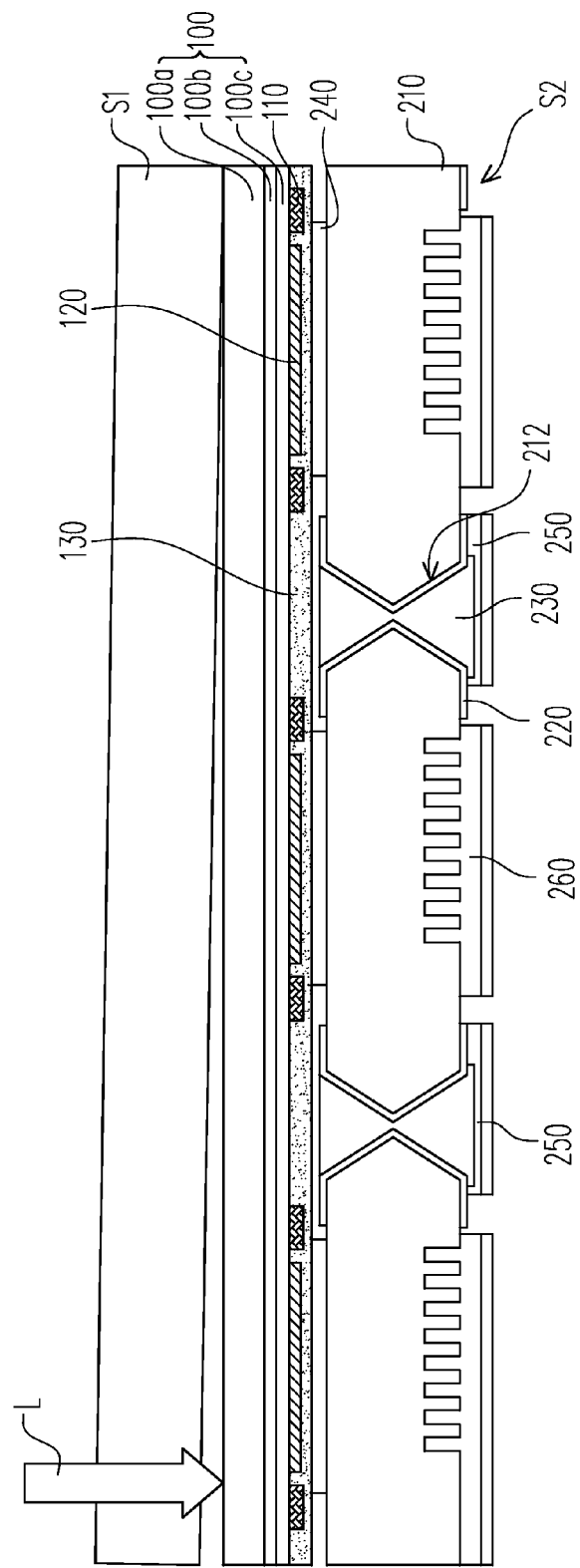

Next, referring to FIG. 3, the semiconductor stacked layer 100 is separated from the growth substrate S1, so that the semiconductor stacked layer 100 is transferred to the carrying substrate S2 from the growth substrate S1. In the present embodiment, the semiconductor stacked layer 100 is separated from the growth substrate S1 by performing a laser lift-off process, a wet etching process, a grinding process, or a polishing process. In detail, when a laser light L having suitable energy irradiates an interface between the growth substrate S1 and the semiconductor stacked layer 100, the semiconductor material around the interface can be vaporised due to the irradiation of the laser light L, so that the semiconductor stacked layer 100 can be lifted-off from the growth substrate S1.

Figure 4:
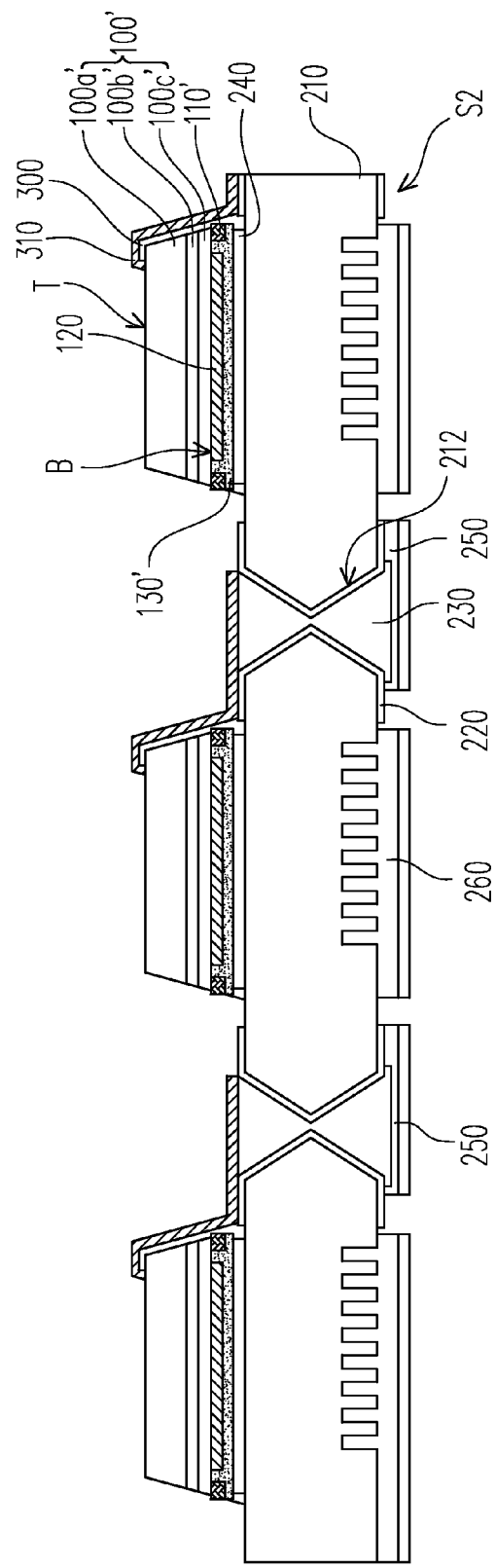

Next, referring to FIG. 4, after the growth substrate S1 is lifted-off, the semiconductor stacked layer 100 is patterned to form a plurality of patterned semiconductor stacked layers 100'. While the semiconductor stacked layer 100 is patterned to form a plurality of the patterned semiconductor stacked layers 100', the barrier pattern 110 and the first bonding layer 130 of FIG. 3 are simultaneously patterned to form a barrier pattern 110' and a first bonding layer 130'. As shown in FIG. 4, each of the patterned semiconductor layers 100' includes a first-type doped semiconductor layer 100a', a light-emitting layer 100b' located on the first-type doped semiconductor layer 100a', and a second-type doped semiconductor layer 100c' located on the light-emitting layer 100b', and each of the patterned semiconductor layers 100' has a top surface T and a bottom surface B. The reflective layer 120 is disposed on the bottom surface B, the barrier pattern 110' is disposed on the bottom surface B and surrounds the reflective layer 120, and the first bonding layer 130' is disposed on the bottom surface B to cover the barrier pattern 110' and the reflective layer 120.

Next, each of the patterned semiconductor stacked layers 100' is electrically connected to the conductive plug 230. In the present embodiment, a dielectric layer 300 can be first formed on a part of the sidewall of each of the patterned semiconductor stacked layers 100', and then a bridge conductor 310 is formed on the dielectric layer 300 and the conductive plug 230. As shown in FIG. 4, the dielectric layer 300 is located between the patterned semiconductor stacked layer 100' and the bridge conductor 310, and the bridge conductor 310 is electrically connected to the top surface T of the patterned semiconductor stacked layer 100' and the conductive plug 230. Therefore, the pad 250 is electrically connected to the top surface T of the patterned semiconductor stacked layer 100' through the conductive plug 230 and the bridge conductor 310, and the conductive plug 230, the pad 250 and the bridge conductor 310 are all insulated to the conductive substrate 210 through the insulating layer 220 and the dielectric layer 300.

Referring to FIG. 4, the first-type doped semiconductor layer 100a' in the patterned semiconductor stacked layer 100' is electrically connected to the conductive plug 230 and the pad 250 through the bridge conductor 310, and the second-type doped semiconductor layer 100c' in the patterned semiconductor stacked layer 100' is electrically connected to the conductive substrate 210 through the reflective layer 120, the first bonding layer 130' and the second bonding layer 240.

Figure 5:
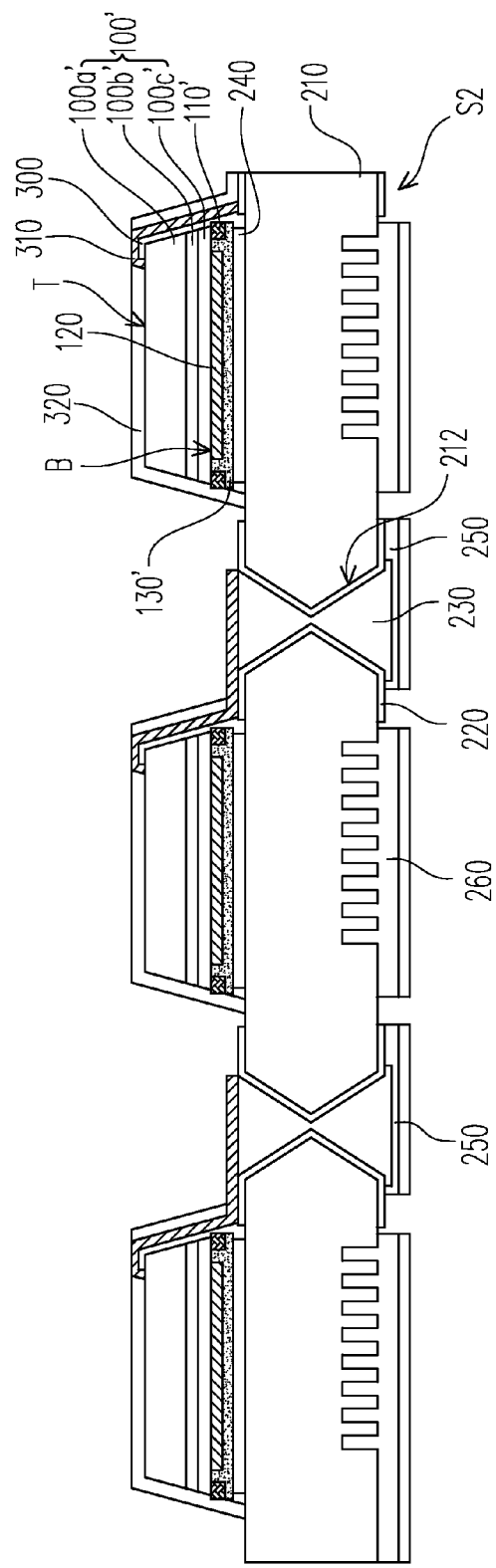

Referring to FIG. 5, after the bridge conductor 310 is fabricated, a light conversion layer 320 is formed to cover the patterned semiconductor stacked layers 100'. In the present embodiment, the patterned semiconductor stacked layer 100' is a LED device capable of emitting blue light, and the light conversion layer 320 includes a fluorescent material capable of being activated by the blue light and emitting yellow light. In other applicable embodiments, the patterned semiconductor stacked layer 100' is a LED device capable of emitting ultraviolet (UV) light, and the light conversion layer 320 includes a fluorescent material (for example, a red light fluorescent material, a green light fluorescent material, a blue light fluorescent material, or combinations thereof) capable of being activated by the UV light and emitting visible light. It should be noticed that fabrication of the light conversion layer 320 is not a necessary procedure for the packaging process, and whether the light conversion layer 320 is coated can be determined according to a design of the packaging process of the LED.

Figure 6:
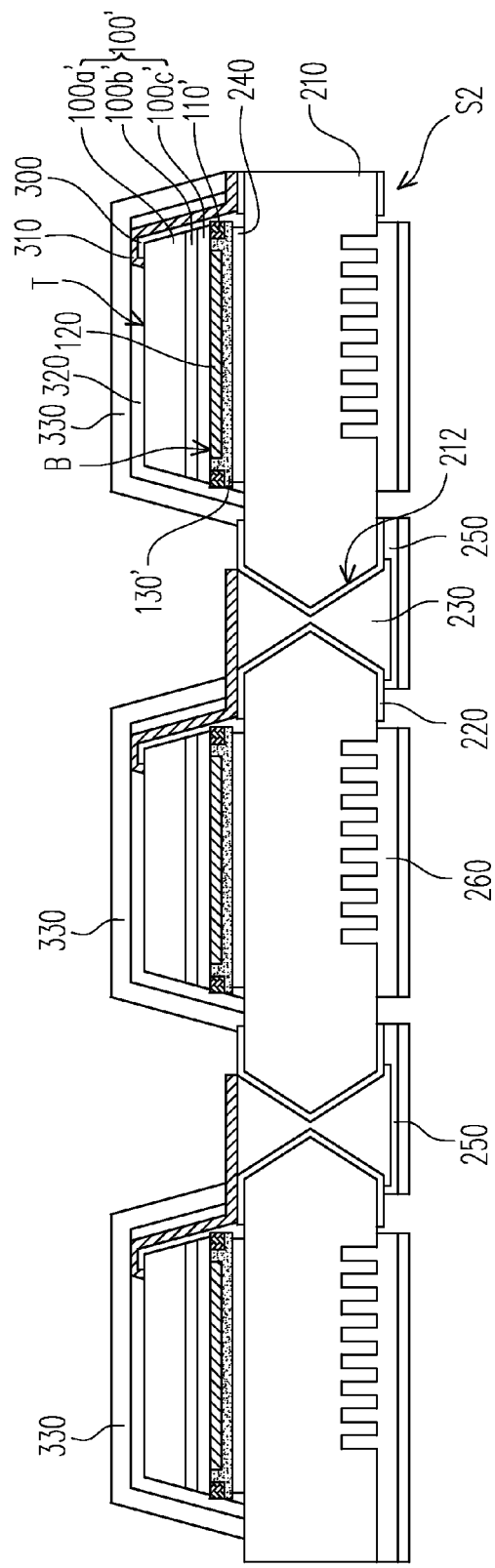

Referring to FIG. 6, an encapsulant 330 is formed on the carrying substrate S2 to cover the patterned semiconductor stacked layers 100'. In the present embodiment, the encapsulant 330 can be entirely or partially formed on the carrying substrate S2, and the encapsulant 330 can be a transparent encapsulant with good optical properties, wherein a material thereof can be silicone.

Figure 7:
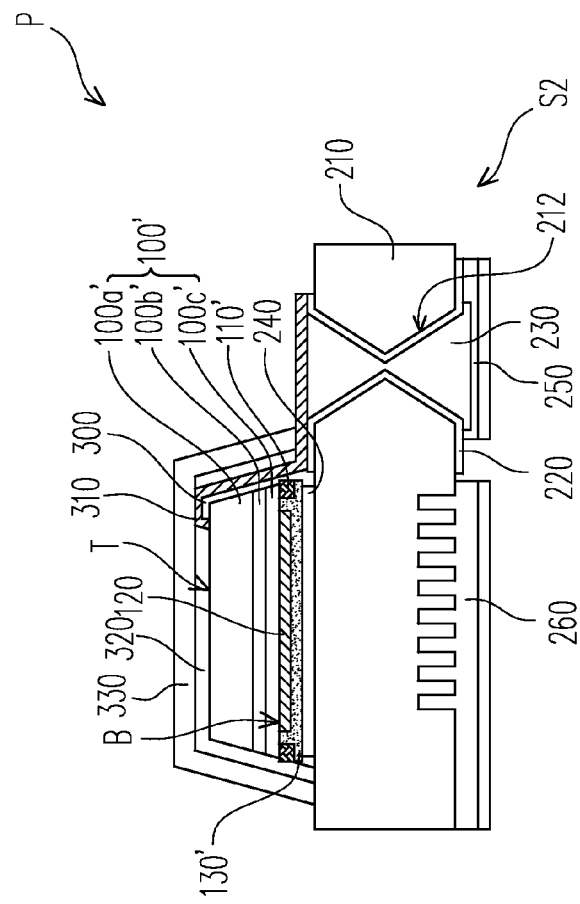

Next, referring to FIG. 7, a singularization process is performed to singularize the carrying substrate S2 into a plurality of LED packages P. The LED package P of the present embodiment includes at least the patterned semiconductor stacked layer 100', the reflective layer 120, the barrier pattern 110', the first bonding layer 130', the carrying substrate S2, the dielectric layer 300, the bridge conductor 310, the light conversion layer 320 and the encapsulant 330. The patterned semiconductor stacked layer 100' has the top surface T and the bottom surface B, and the reflective layer 120 is disposed on the bottom surface B. The barrier pattern 110' is disposed on the bottom surface B and surrounds the reflective layer 120, and the first bonding layer 130' is disposed on the bottom surface B to cover the barrier pattern 110' and the reflective layer 120. The carrying substrate S2 includes the conductive substrate 210, the insulating layer 220, at least the conductive plug 230 and the second bonding layer 240. The conductive substrate 210 has at least the through hole 212, and the insulating layer 220 is disposed on the sidewall of the through hole 212. The conductive plug 230 is disposed in the through hole 212 and is electrically insulated to the conductive substrate 210. The second bonding layer 240 is disposed on the conductive substrate 210, and the second bonding layer 240 is electrically connected to the second-type doped semiconductor layer 100c' of the patterned semiconductor stacked layer 100' through the first bonding layer 130'.

The dielectric layer 300 is disposed on a part of the sidewall of each of the patterned semiconductor stacked layers 100'. The bridge conductor 310 is disposed on the dielectric layer 300, and is electrically connected to the second-type doped semiconductor layer 100a' and the conductive plug 230. Moreover, the light conversion layer 320 covers the patterned semiconductor stacked layers 100', and the encapsulant 330 is disposed on the carrying substrate S2 to cover the patterned semiconductor stacked layers 100' and the light conversion layer 320.

Figure 8:
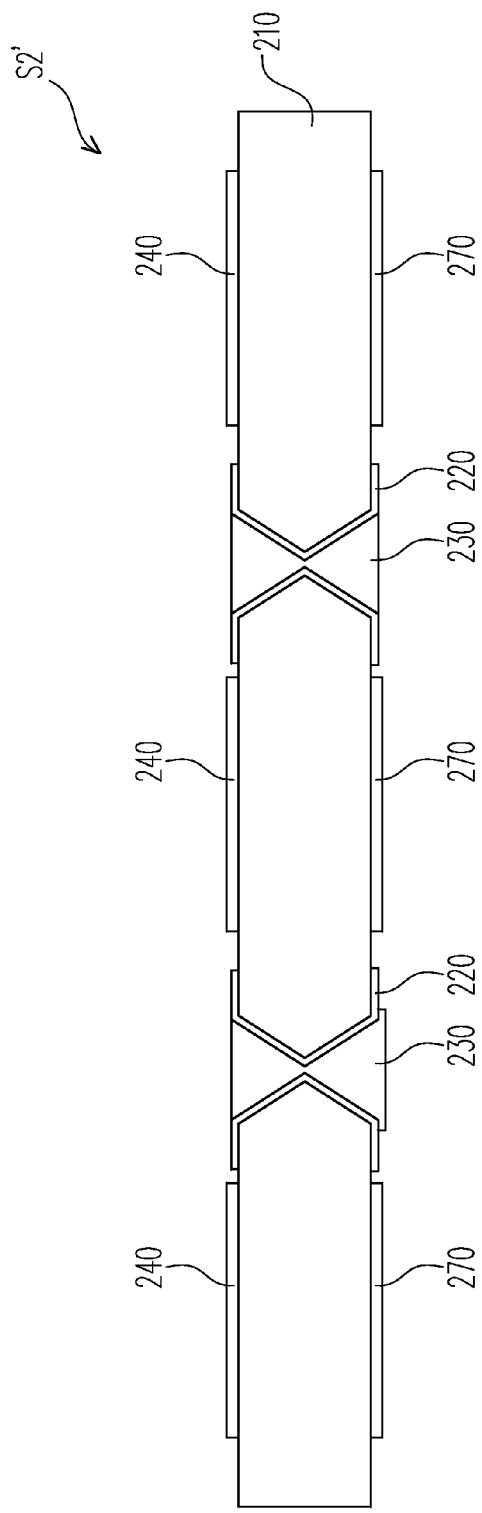
FIG. 8 is a cross-sectional view of a carrying substrate according to another embodiment of the present invention.

FIG. 8 is a cross-sectional view of a carrying substrate according to another embodiment of the present invention. Referring to FIG. 8, the carrying substrate S2' of the present embodiment is similar to the aforementioned carrying substrate S2, and a difference therebetween is that the carrying substrate S2' does not include the heat sink 260 and the pad 250 electrically connected to the conductive plug 230, but includes a pad 270 electrically connected to the conductive substrate 210.

Second Embodiment

Figure 9A:
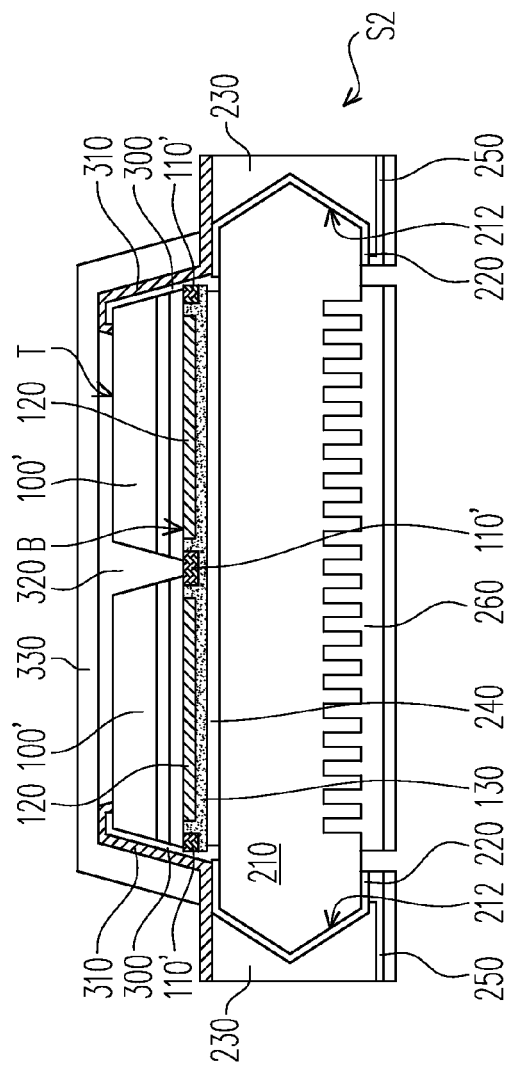
FIG. 9A is a cross-sectional view of a LED package according to a second embodiment of the present invention.
Figure 9B:
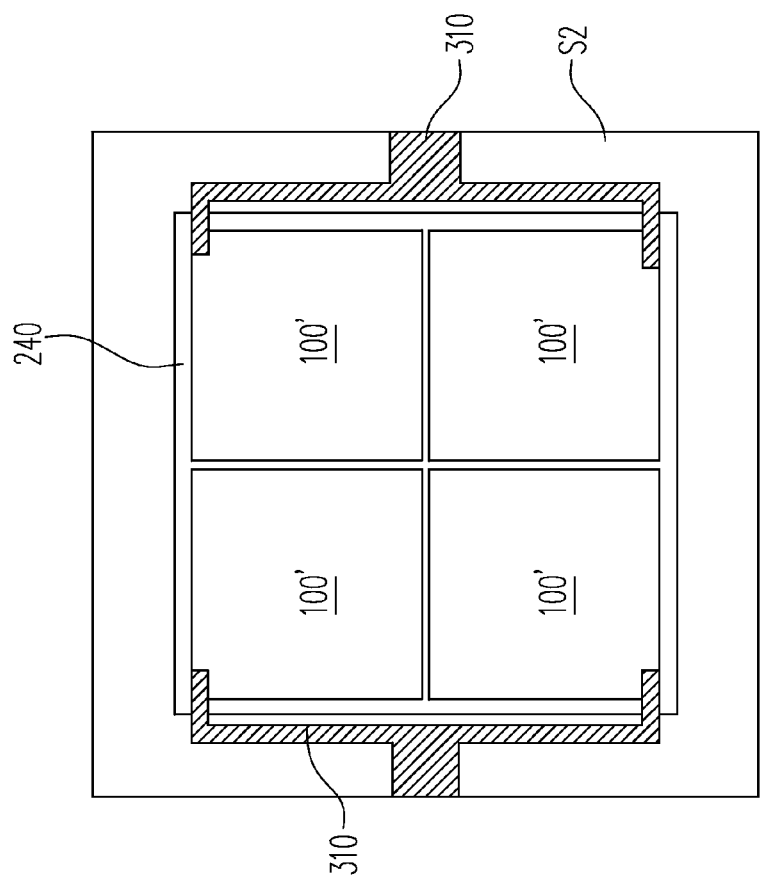
FIG. 9B is a top view of a LED package according to a second embodiment of the present invention.
Figure 9C:
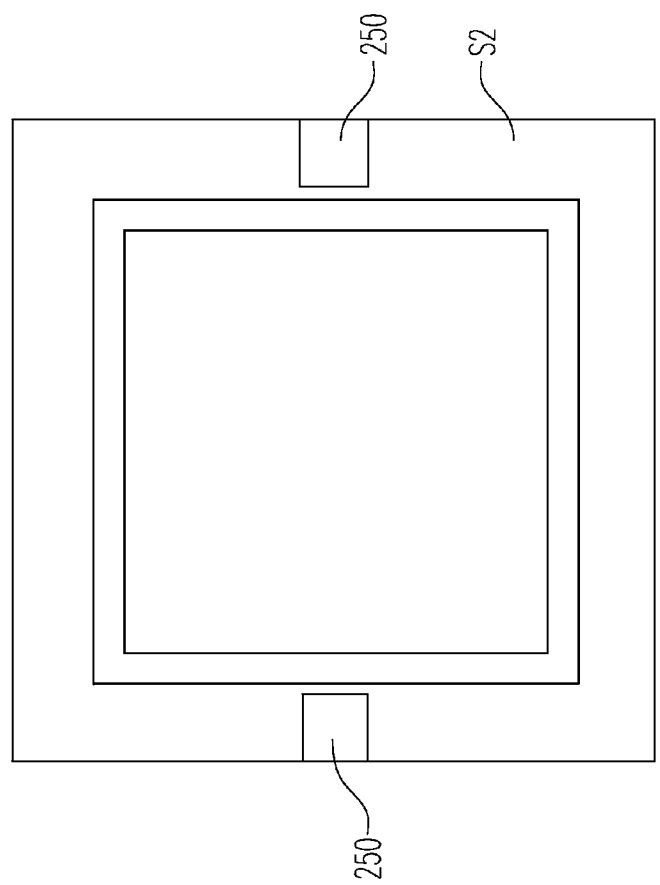
FIG. 9C is a bottom view of a LED package according to a second embodiment of the present invention.

FIG. 9A is a cross-sectional view of a LED package according to the second embodiment of the present invention, FIG. 9B is a top view of the LED package according to the second embodiment of the present invention, and FIG. 9C is a bottom view of the LED package according to the second embodiment of the present invention. Referring to FIG. 9A, FIG. 9B and FIG. 9C, the LED package P' of the present embodiment has a plurality of the patterned semiconductor stacked layers 100' arranged in an array on the carrying substrate S2. As shown in FIGS. 9A-9C, the bottom surface B of each of the patterned semiconductor stacked layers 100' can be electrically connected to the conductive substrate 210 through the reflective layer 120, the first bonding layer 130' and the second bonding layer 240, and the top surface T of each of the patterned semiconductor stacked layers 100' is electrically connected to the conductive plug 230 through the bridge conductor 310.

Since fabrications of the reflective layers and the barrier patterns are integrated to the wafer-level packaging process of the LEDs, the LED packages with good optical properties and good reliability can be fabricated according to the wafer-level packaging process of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting diode (LED) package, comprising:
   at least a patterned semiconductor stacked layer having a top surface and a bottom surface;
   a reflective layer disposed on the bottom surface;
   a barrier pattern disposed on the bottom surface and surrounding the reflective layer;
   a first bonding layer disposed on the bottom surface to cover the barrier pattern and the reflective layer;
   a carrying substrate comprising:
      a conductive substrate having at least a through hole;
      an insulating layer disposed on a sidewall of the through hole;
      at least a conductive plug disposed in the through hole and electrically insulated to the conductive substrate; and
      a second bonding layer disposed on the conductive substrate, wherein the second bonding layer is electrically connected to the bottom surface through the first bonding layer;
   at least a bridge conductor electrically connected to the top surface and the conductive plug;
   an encapsulant disposed on the carrying substrate to cover the patterned semiconductor stacked layers; and
   a dielectric layer disposed on a sidewall of the patterned semiconductor stacked layer, wherein the dielectric layer is located between the patterned semiconductor stacked layer and the bridge conductor.

2. The LED package as claimed in claim 1, wherein a material of the barrier pattern comprises silicon oxide, silicon nitride or indium tin oxide.

3. The LED package as claimed in claim 1, wherein a material of the reflective layer comprises silver.

4. The LED package as claimed in claim 1, wherein a material of the first bonding layer comprises titanium, tungsten, titanium tungsten, nickel, platinum, aurum, aurum tin alloy, indium, or combinations thereof.

5. The LED package as claimed in claim 1, wherein the carrying substrate further comprises a pad, wherein the pad is electrically connected to the top surface through the conductive plug and the bridge conductor, and the pad is electrically insulated to the conductive substrate.

6. The LED package as claimed in claim 5, wherein the pad and the patterned semiconductor stacked layer are respectively located at two opposite sides of the conductor substrate.

7. The LED package as claimed in claim 1, wherein the carrying substrate further comprises a heat sink, wherein the heat sink is disposed on the conductive substrate, and the heat sink and the patterned semiconductor stacked layer are respectively located at two opposite sides of the conductive substrate.

8. The LED package as claimed in claim 1, further comprising a light conversion layer covering the patterned semiconductor stacked layers.

* * * * *